United States Patent
Yamada et al.

(10) Patent No.: US 10,094,890 B2
(45) Date of Patent: *Oct. 9, 2018

(54) MAGNETIC SENSOR

(71) Applicant: Panasonic Intellectual Property Management Co., Ltd., Osaka (JP)

(72) Inventors: Kiyotaka Yamada, Osaka (JP); Kazuhiro Onaka, Hyogo (JP); Noritaka Ichinomiya, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/300,747

(22) PCT Filed: Sep. 16, 2015

(86) PCT No.: PCT/JP2015/004721
§ 371 (c)(1),
(2) Date: Sep. 29, 2016

(87) PCT Pub. No.: WO2016/056179
PCT Pub. Date: Apr. 14, 2016

(65) Prior Publication Data
US 2017/0242082 A1    Aug. 24, 2017

(30) Foreign Application Priority Data

Oct. 9, 2014 (JP) .................................. 2014-207913
Dec. 10, 2014 (JP) .................................. 2014-250070

(51) Int. Cl.
*G01R 33/09* (2006.01)

(52) U.S. Cl.
CPC .................................. *G01R 33/091* (2013.01)

(58) Field of Classification Search
CPC ....... G01R 33/045; G01R 33/04; G01R 33/02
See application file for complete search history.

(56) References Cited

U.S. PATENT DOCUMENTS 5,539,153 A    7/1996 Schwiebert et al.
5,631,557 A *  5/1997 Davidson ............. G01D 11/245
                                                324/174

(Continued)

FOREIGN PATENT DOCUMENTS

JP    04-026227 A    1/1992
JP    04-282480 A    10/1992

(Continued)

OTHER PUBLICATIONS

Axis—definition of axis by the Free Dictionary.*
(Continued)

*Primary Examiner* — Giovanni Astacio-Oquendo
*Assistant Examiner* — Alvaro Fortich
(74) *Attorney, Agent, or Firm* — McDermott Will & Emery LLP

(57) ABSTRACT

A magnetic sensor includes a board, a magnetoresistance element group including first and second magnetoresistance elements disposed on the board, and a magnet group including a first magnet corresponding to the first magnetoresistance element and a second magnet corresponding to the second magnetoresistance element. This magnetic sensor can have a small size and high accuracy.

17 Claims, 12 Drawing Sheets

(56) References Cited

U.S. PATENT DOCUMENTS

| | | | |
|---|---|---|---|
| 5,972,185 A * | 10/1999 | Hendricks | C23C 14/325 204/192.38 |
| 6,064,197 A | 5/2000 | Lochmann et al. | |
| 6,111,715 A * | 8/2000 | Tsuchiya | G11B 5/00813 360/61 |
| 6,285,097 B1 * | 9/2001 | Hazelton | G03F 7/70758 310/12.06 |
| 6,356,074 B1 | 3/2002 | Ohkawa et al. | |
| 6,441,514 B1 * | 8/2002 | Markle | G03F 7/70758 310/12.06 |
| 6,675,124 B2 | 1/2004 | Koga | |
| 7,417,269 B2 | 8/2008 | Ao et al. | |
| 7,592,803 B1 | 9/2009 | Guo et al. | |
| 8,089,233 B2 | 1/2012 | Kanekawa et al. | |
| 8,106,647 B2 | 1/2012 | Oohira | |
| 8,692,546 B2 | 4/2014 | Cesaretti et al. | |
| 9,046,562 B2 | 6/2015 | Cummings et al. | |
| 2002/0171416 A1 * | 11/2002 | Schroeder | A63B 69/3614 324/176 |
| 2004/0248327 A1 | 12/2004 | Onaka | |
| 2005/0007102 A1 * | 1/2005 | Butzmann | G01R 33/09 324/207.21 |
| 2005/0054120 A1 * | 3/2005 | Wakui | B82Y 25/00 438/3 |
| 2005/0110166 A1 * | 5/2005 | Aoyagi | H01L 24/97 257/781 |
| 2006/0049902 A1 * | 3/2006 | Kaufman | A61N 5/10 335/306 |
| 2006/0124450 A1 * | 6/2006 | Beers | C23C 14/325 204/192.38 |
| 2007/0159159 A1 * | 7/2007 | Okada | G01R 15/205 324/117 H |
| 2008/0246572 A1 * | 10/2008 | Iwai | G03G 15/0921 335/302 |
| 2008/0276474 A1 * | 11/2008 | Hayama | G01C 17/30 33/355 R |
| 2009/0045489 A1 * | 2/2009 | Koon | H01L 23/3107 257/666 |
| 2011/0025321 A1 * | 2/2011 | Yamazaki | G01D 5/145 324/252 |
| 2011/0215797 A1 * | 9/2011 | Steinich | G01B 7/003 324/207.25 |
| 2011/0246133 A1 | 10/2011 | Harada et al. | |
| 2012/0200292 A1 * | 8/2012 | Sugihara | B82Y 25/00 324/252 |
| 2015/0175191 A1 | 6/2015 | Harada et al. | |
| 2015/0262701 A1 * | 9/2015 | Takizawa | G11C 11/161 365/96 |

FOREIGN PATENT DOCUMENTS

| | | |
|---|---|---|
| JP | 06-310776 A | 11/1994 |
| JP | 10-224039 | 8/1998 |
| JP | 11-211409 | 8/1999 |
| JP | 2001-227985 | 8/2001 |
| JP | 2002-213944 A | 7/2002 |
| JP | 2003-130933 | 5/2003 |
| JP | 3474096 B2 | 12/2003 |
| JP | 2004-172430 A | 6/2004 |
| JP | 2006-208025 | 8/2006 |
| JP | 2007-155668 A | 6/2007 |
| JP | 2008-157639 A | 7/2008 |
| JP | 4138952 B2 | 8/2008 |
| JP | 2008-304470 A | 12/2008 |
| JP | 4244807 B2 | 3/2009 |
| JP | 2009-175073 A | 8/2009 |
| JP | 2009-264866 | 11/2009 |
| JP | 2011-180001 | 9/2011 |
| JP | 2011-525631 | 9/2011 |
| JP | 4863953 B2 | 1/2012 |
| JP | 2012-063203 | 3/2012 |
| JP | 2012-204808 A | 10/2012 |
| JP | 5083281 B2 | 11/2012 |
| JP | 2013-024674 | 2/2013 |
| JP | 2013-207097 | 10/2013 |
| JP | 2013-258169 A | 12/2013 |
| JP | 5620989 B2 | 11/2014 |
| JP | 5638900 B2 | 12/2014 |
| JP | 2015-082633 | 4/2015 |
| JP | 5708986 B2 | 4/2015 |
| JP | 2015-108527 | 6/2015 |
| JP | 2015-116964 A | 6/2015 |
| JP | 5844425 B2 | 1/2016 |
| WO | 2014/148087 A1 | 9/2014 |

OTHER PUBLICATIONS

International Search Report of PCT application No. PCT/JP2015/004721 dated Dec. 1, 2015.
Symmetry and asymmetry—definition of Symmetry and asymmetry by the Free Dictionary.
International Search Report of PCT application No. PCT/JP2015/001381 dated Jun. 2, 2015; with English translation.
Non-Final Office Action issued in U.S. Appl. No. 15/121,021, dated Nov. 1, 2017.

* cited by examiner

MAGNETIC SENSOR

CROSS-REFERENCE TO RELATED APPLICATIONS

This application is a U.S. national stage application of the PCT international application No. PCT/JP2015/004721 filed on Sep. 16, 2015, which claims the benefit of foreign priority of Japanese patent application No. 2014-207913 filed on Oct. 9, 2014 and Japanese patent application No. 2014-250070 filed on Dec. 10, 2014, the contents all of which are incorporated herein by reference.

TECHNICAL FIELD

The present invention relates to a magnetic sensor including a bias magnet.

BACKGROUND ART

PTL 1 discloses a conventional magnetic sensor in which one bias magnet is disposed directly below four magnetoresistance elements. PTL 2 discloses another conventional magnetic sensor in which a bias magnet is disposed to cover a region above a magnetoresistance element. The conventional magnetic sensors can hardly have small sizes and high accuracy.

PTLs 2 to 5 disclose conventional magnetic sensors in which plural magnetoresistance elements are disposed on a board. In each of PTLs 2 to 5, a specific configuration and a specific shape of each of the magnetoresistance elements are not clear. Therefore, PTLs 2 to 5 cannot provide a magnetic sensor having high sensitivity to a magnetic field.

CITATION LIST

Patent Literature

PTL 1: Japanese Patent Laid-Open Publication No. 2006-208025
PTL 2: Japanese Patent Laid-Open Publication No. 2013-024674
PTL 3: Japanese Laid-Open Patent Publication No. 2011-525631
PTL 4: Japanese Patent Laid-Open Publication No. 2012-063203
PTL 5: Japanese Patent Laid-Open Publication No. 2003-130933

SUMMARY

A magnetic sensor includes a board, a magnetoresistance element group including first and second magnetoresistance elements disposed on the board, and a magnet group that includes a first magnet corresponding to the first magnetoresistance element and a second magnet corresponding to the second magnetoresistance element.

This magnetic sensor can have a small size and high accuracy.

DETAIL DESCRIPTION OF PREFERRED EMBODIMENTS

Exemplary Embodiment 1

Figure 1:
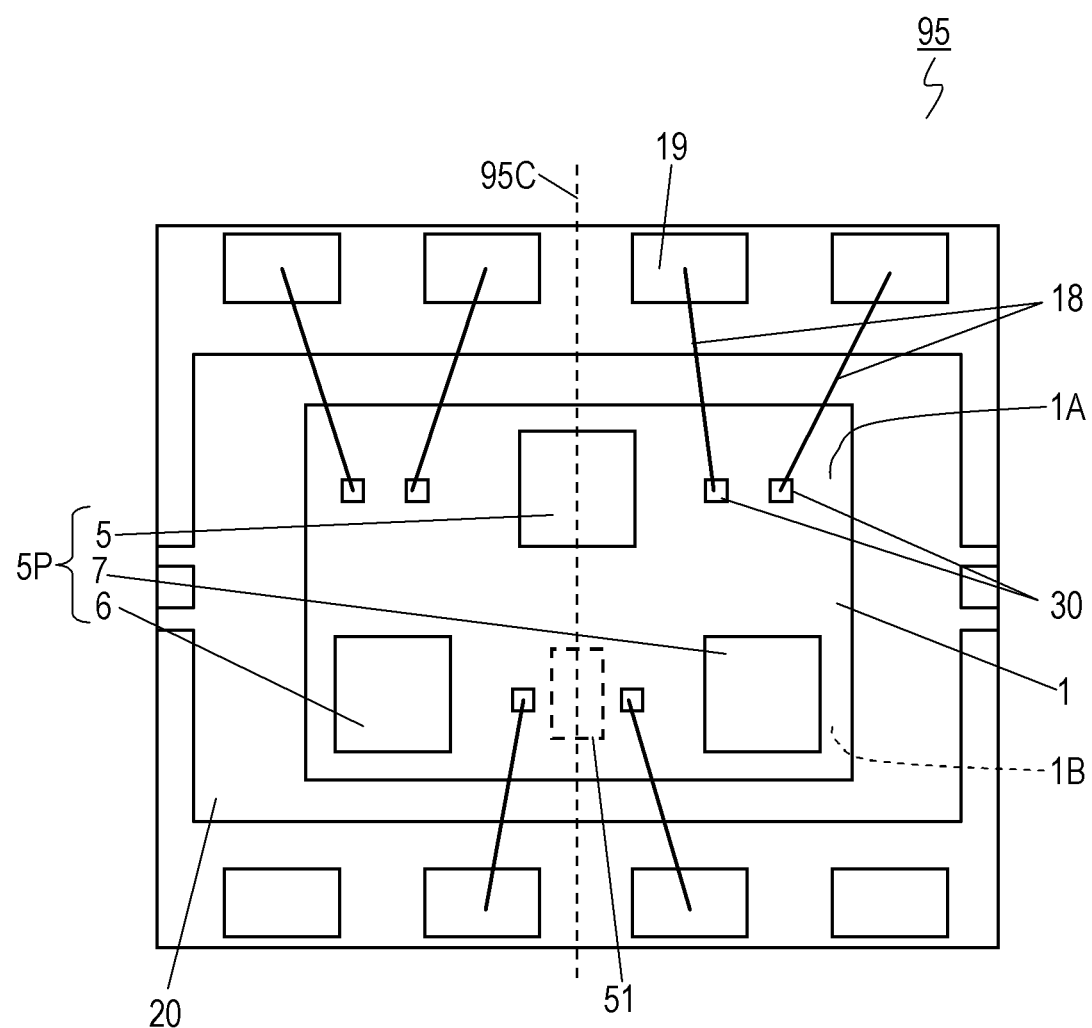
FIG. 1 is a schematic diagram of a magnetic sensor according to Exemplary Embodiment 1.

A magnetic sensor according to Exemplary Embodiment 1 will be described below with reference to FIGS. 1 to 5A, and 5B. In FIGS. 1 to 5A and 5B, the same components are denoted by the same reference numerals, and their description will not be repeated. FIGS. 1 to 5A and 5B show an example of a preferable exemplary embodiment, and the invention is not limited to configurations, shapes, and numerical values shown in FIGS. 1 to 5A and 5B. In addition, respective elemental techniques described in this exemplary embodiment can be combined within a range where they are not contradictory to each other.

Figure 2:
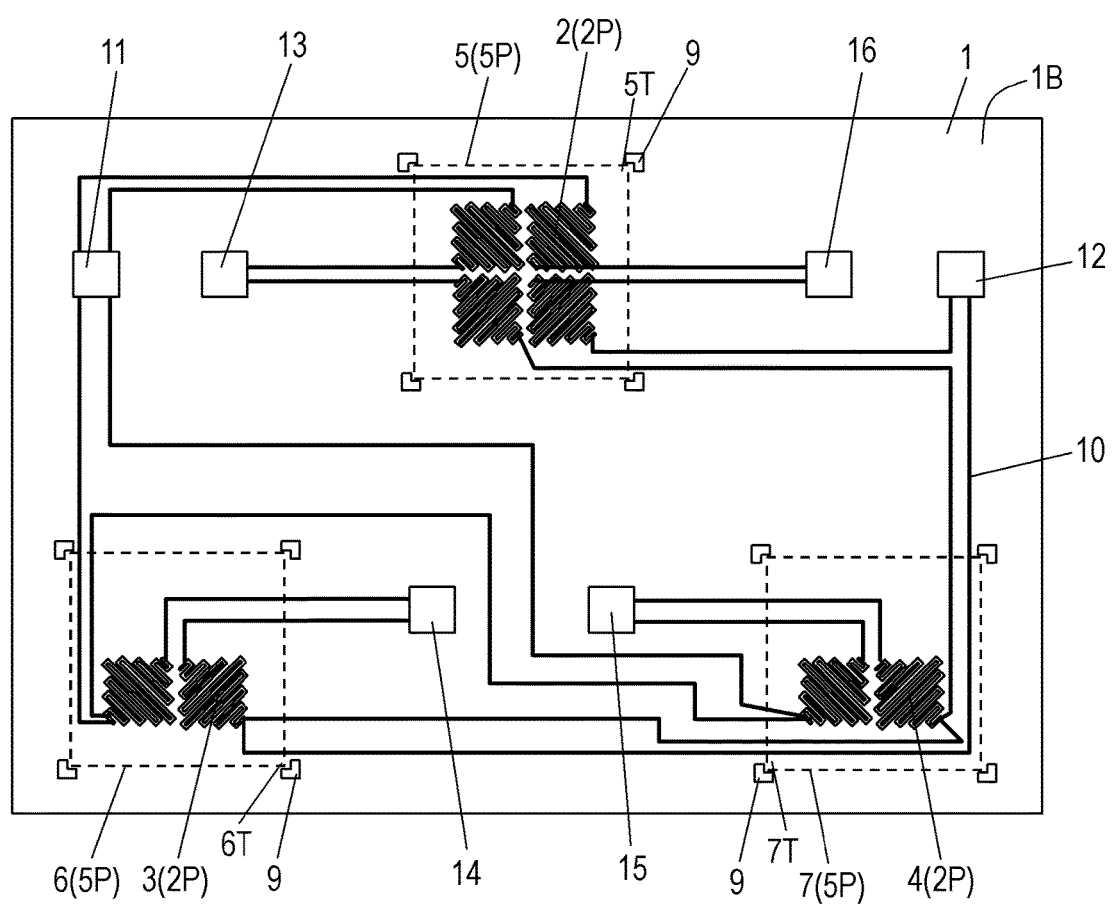
FIG. 2 is a schematic top view of a board having magnetoresistance elements disposed thereon of the magnetic sensor according to Embodiment 1.

A basic configuration and a sensing method of a magnetic sensor according to Embodiment 1 will be described below. FIG. 1 is a schematic diagram of magnetic sensor 95 according to Embodiment 1. Magnetic sensor 95 includes board 1. FIG. 2 is a schematic top view of board 1. Board 1 has surface 1A and surface 1B opposite to surface 1A. Board 1 is disposed on die pad 20. Magnetoresistance elements 2, 3, and 4 are disposed on surface 1A of board 1. Plural pads 30 are disposed on board 1. Pads 30 include pads for reading outputs from magnetoresistance elements 2, 3, and 4, a pad for applying a voltage to magnetoresistance elements 2, 3, and 4, and a pad for connecting magnetoresistance elements 2, 3, and 4 to a ground. Magnet group 5P includes magnets 5 and 6 disposed on board 1. Magnet group 5P preferably further includes magnet 7. Plural external terminals 19 and plural pads 30 of magnetic sensor 95 are electrically connected through wirings 18.

As shown in FIG. 1, surface 1B of board 1 is preferably mounted on die pad 20. Die pad 20 is made of a metal and is disposed on a ground pattern such that noise from outside of magnetic sensor 95 can be removed over the entire region of magnetic sensor 95.

FIG. 2 mainly shows magnetoresistance element patterns constituting magnetoresistance elements 2, 3, and 4 on board 1, wiring patterns constituting wirings 10, pads 30. Magnet group 5P (magnets 5, 6, and 7) is disposed in regions indicated by dotted lines.

As shown in FIG. 2, magnetic sensor 95 according to Embodiment 1 includes board 1 having surface 1A and surface 1B opposite to surface 1A, magnetoresistance element group 2P including magnetoresistance elements 2, 3, and 4 disposed on surface 1A of board 1, and magnet group 5P including magnet 5 corresponding to magnetoresistance element 2 and magnet 6 corresponding to magnetoresistance element 3.

In the magnetic sensor 95 according to Embodiment 1, separate magnets 5, 6, and 7 can apply magnetic biases to magnetoresistance elements 2, 3, and 4 constituting magnetoresistance element group 2P. Accordingly, the degree of freedom for design can be improved. For example, the magnetic biases can be applied to magnetoresistance elements 2, 3, and 4 not only in the same direction but also in different directions. Further reduction in size and further improvement in accuracy can thus be realized.

PTLs 1 and 2 disclose only one bias magnet disposed on a metal pattern of one or plural magnetoresistance elements. This structure can hardly provide a small size and high accuracy.

Figure 3A:
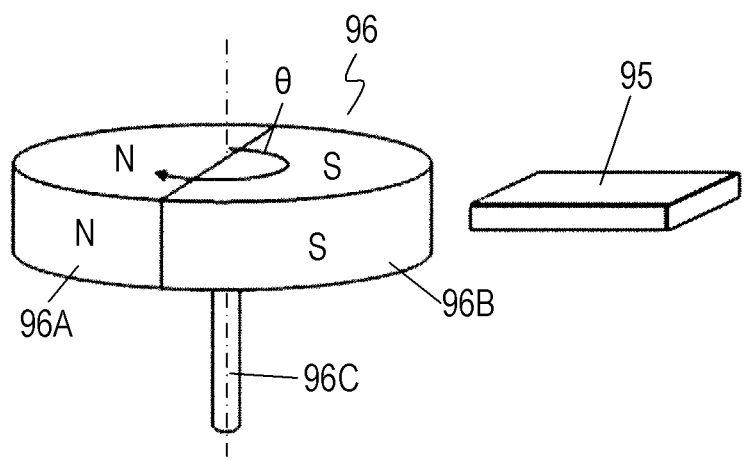
FIG. 3A is a perspective view of the magnetic sensor according to Embodiment 1 for illustrating an operation of the magnetic sensor.
Figure 3B:
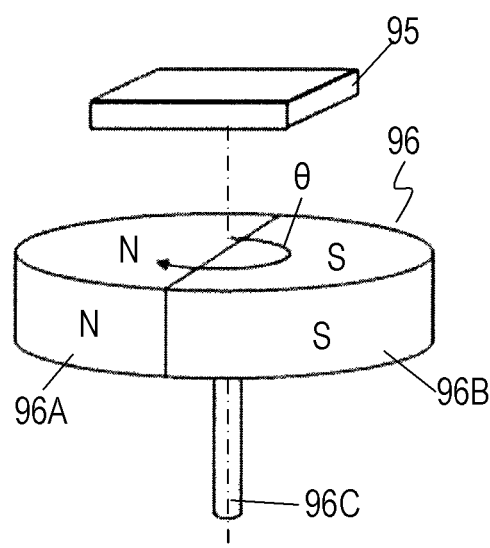
FIG. 3B is a perspective view of the magnetic sensor according to Embodiment 1 for illustrating another operation of the magnetic sensor.

FIGS. 3A and 3B are perspective views of magnetic sensor 95 for illustrating operations thereof. In FIG. 3A, magnetic sensor 95 is disposed next to target magnet 96. In FIG. 3B, magnetic sensor 95 is disposed above target magnet 96. Target magnet 96 shown in FIGS. 3A and 3B is rotatable about rotation axis 96C. In accordance with Embodiment 1, target magnet 96 has a disk shape having a center having rotation axis 96C passing through the center. Target magnet 96 is divided into magnetic poles 96A and 96B having opposite polarities by a plane passing through the center of the disk shape. In accordance with Embodiment 1, magnetic pole 96A is an N pole, and magnetic pole 96B is an S pole. The target magnet may have a configuration other than the above-described configuration. For example, the target magnet may have a plate shape having an N pole and an S pole that are alternately disposed on a straight line.

As shown in FIGS. 3A and 3B, magnetic sensor 95 is disposed so as to be movable relatively in a direction from magnetic pole 96A to magnetic pole 96B of the target magnet or in a direction from magnetic pole 96B to magnetic pole 96A. Specifically, magnetic sensor 95 and target magnet 96 are disposed as to satisfy a position relationship in which, upon rotating of target magnet 96, the magnetic poles of target magnet 96 passing through the region next to or above magnetic sensor 95 alternately change from magnetic pole 96A to magnetic pole 96B and from magnetic pole 96B to magnetic pole 96A. The magnetic sensor has a resistance changing depending on, for example, the intensity of a magnetic field in a particular direction. Therefore, magnetic sensor 95 can read a change in the resistance values of magnetoresistance elements 2, 3, and 4 depending on a change from magnetic pole 96A to magnetic pole 96B and a change from magnetic pole 96B to magnetic pole 96A. Magnetic sensor 95 detects rotation angle θ of target magnet 96 about rotation axis 96C based on the resistance values of magnetoresistance elements 2, 3, and 4, and detects a rotation angle of a measurement target including target magnet 96.

The above-described operations of magnetic sensor 95 will be detailed below. For example, in the case that an angle between a direction of a magnetic bias applied to magnetoresistance element 2 by magnet 5 and a direction of a magnetic bias applied to magnetoresistance element 3 by magnet 6 is 90 degrees, output characteristics of magnetoresistance element 2 and magnetoresistance element 3 corresponding to the change from magnetic pole 96A to magnetic pole 96B and change from magnetic pole 96B to magnetic pole 96A in target magnet 96, that is, the changes in the resistance values of magnetoresistance elements 2 and 3 depending on rotation angle θ of target magnet 96 are proportional to a sine wave (sin θ) and a cosine wave (cos θ), respectively. The reason is that directions of magnetic fields applied from target magnet 96 to magnetoresistance elements 2 and 3 are shifted by 90 degrees by magnets 5 and 6 applied to magnetoresistance elements 2 and 3. Tangent tan θ is calculated based on the sine wave and the cosine wave, and thus rotation angle θ can be calculated. The rotation angle of the measurement target can thus be detected.

As shown in FIGS. 1 and 2, magnetoresistance element group 2P preferably includes magnetoresistance element 4. Magnet group 5P preferably includes magnet 7 corresponding to magnetoresistance element 4. Magnet 7 applies a magnetic bias to magnetoresistance element 4. In a plan view, magnetoresistance element 3 and magnetoresistance element 4 are preferably arranged symmetrically to each other with respect to axis 95C, and magnetoresistance element 2 is disposed on axis 95C. Magnetoresistance element 2 is preferably connected to voltage application pad 11, ground pad 12, output terminal 13, and output terminal 16. Magnetoresistance element 3 is preferably connected to voltage application pad 11, ground pad 12, and output terminal 14. Magnetoresistance element 4 is preferably connected to voltage application pad 11, ground pad 12, and output terminal 15. Magnetoresistance element 4 is connected indirectly to ground pad 12 via magnetoresistance element 2 or magnetoresistance element 3. This configuration secures the reliability of a sensing function of the magnetic sensor.

The operation of magnetic sensor 95 detecting target magnet 96 will be detailed below. First, output V1 and output V4 which are resistance value change characteristics of magnetoresistance element 2 are expressed as Formula 1.

$$V1=V4=\sin\theta \qquad \text{[Formula 1]}$$

At this moment, when a direction of a magnetic bias of magnet 6 is shifted from a direction of a magnetic bias of magnet 5 by 90 degrees, output V2 which is a resistance value change characteristic of magnetoresistance element 3 is expressed by Formula 2.

$$V2=\sin(\theta+90°)=\cos\theta \qquad \text{[Formula 2]}$$

When a direction of a magnetic bias of magnet 7 is shifted from the direction of the magnetic bias of magnet 6 by 180 degrees (is shifted from the direction of the magnetic bias of magnet 5 by −90 degrees), output V3 which is a resistance value change characteristic of magnetoresistance element 4 is expressed by Formula 3.

$$V3=\sin(\theta-90°)=-\cos\theta \quad \text{[Formula 3]}$$

Difference V12 between output V1 and output V2 is expressed by Formula 4.

$$V12=V1-V2=\sin\theta-\cos\theta=\sqrt{2}\sin(\theta-45°) \quad \text{[Formula 4]}$$

Difference V34 between output V3 and output V4 is expressed by Formula 5.

$$V34=V4-V3=\sin\theta-(-\cos\theta)=\sqrt{2}\sin(\theta+45°) \quad \text{[Formula 5]}$$

As shown in Formulas 3 and 4, a phase shift of 90 degrees is generated between difference V12 and difference V34. Therefore, in the case that difference V12 is a sine wave, difference V34 is a cosine wave. Tangent $\tan\theta$ is calculated based on differences V12 and V34, that is, based on the sine wave and the cosine wave, and thus rotation angle $\theta$ can be calculated. The rotation angle of the measurement target can thus be detected.

Structures of magnetoresistance elements 2, 3, and 4 of magnetic sensor 95 according to Embodiment 1 will be described below. In addition, directions of magnetic biases of magnets 5, 6, and 7 constituting magnet group 5P will be described.

Figure 4A:
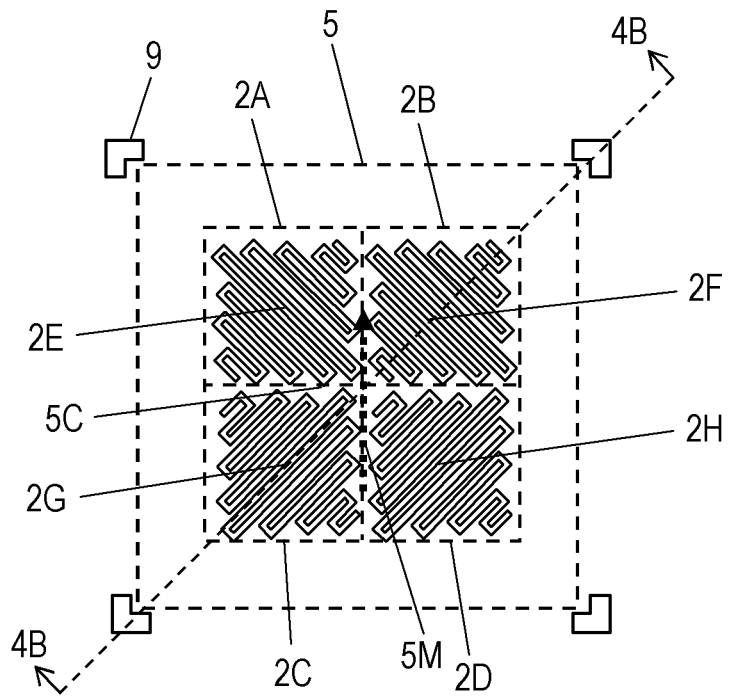
FIG. 4A is an enlarged view of a magnetoresistance element of the magnetic sensor according to Embodiment 1.
Figure 4B:
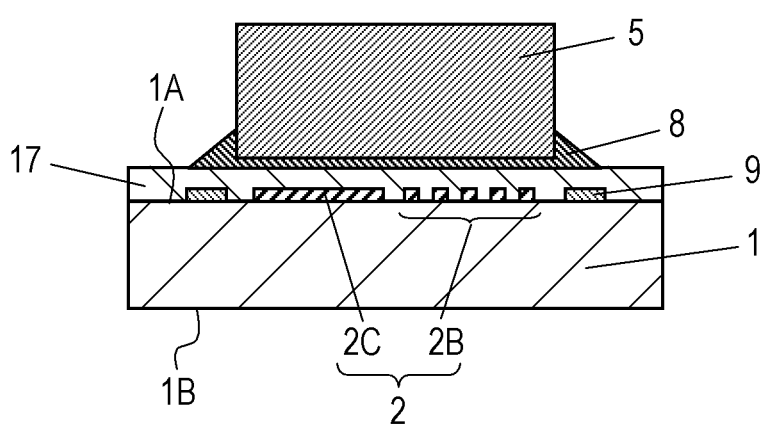
FIG. 4B is a cross-sectional view of the magnetoresistance element on line 4B-4B shown in FIG. 4A.
Figure 5A:
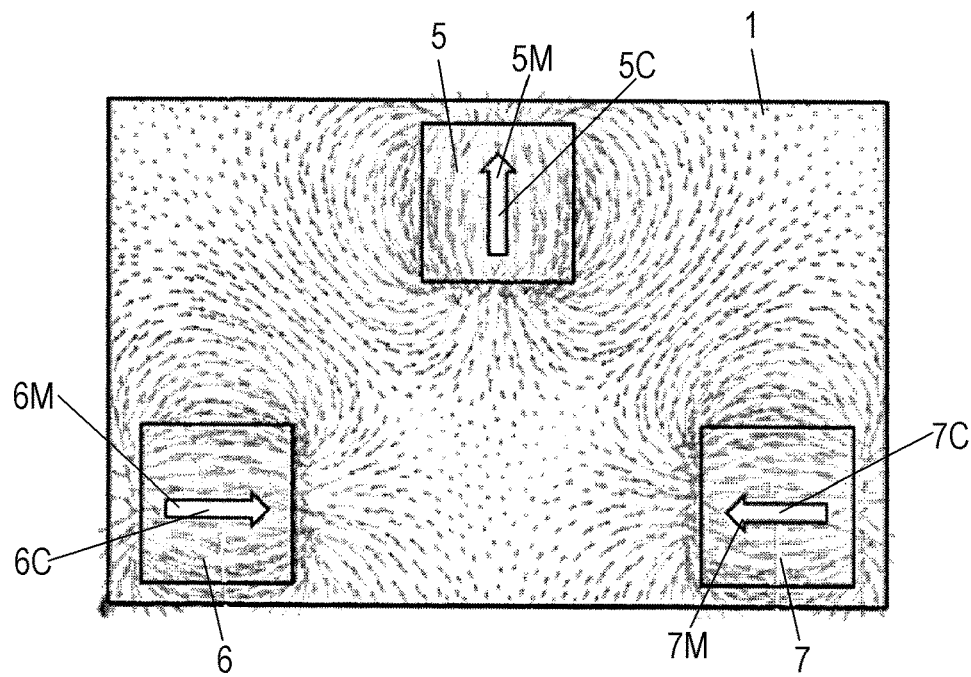
FIG. 5A is a plan view showing of the magnetic sensor according to Embodiment 1 for illustrating directions of magnetic biases of magnets of a magnet group.
Figure 5B:
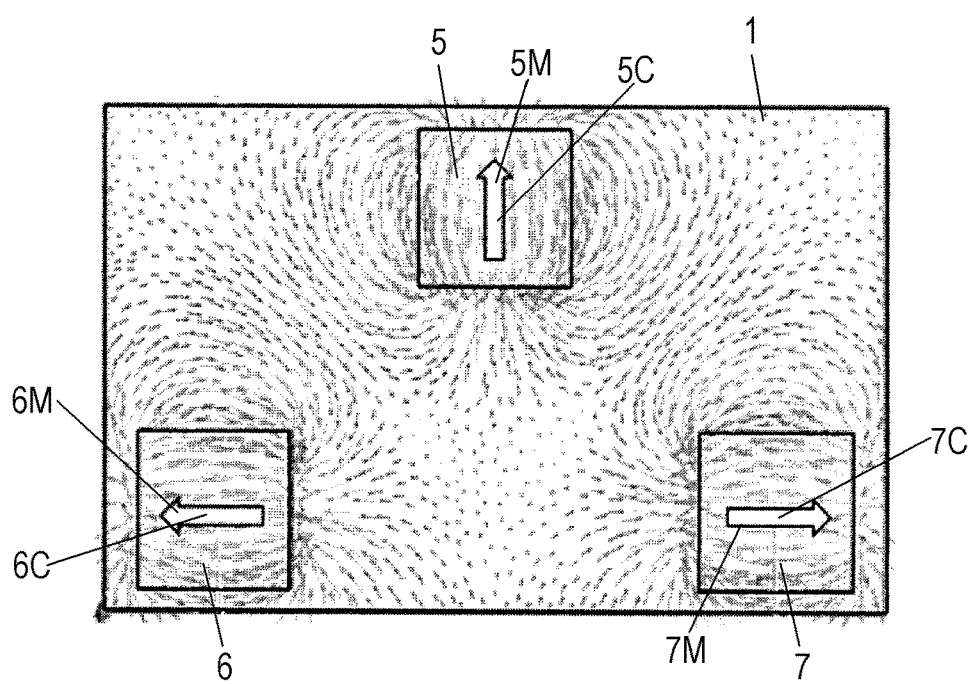
FIG. 5B is a plan view of the magnetic sensor according to Embodiment 1 for illustrating directions of other magnetic biases of magnets of a magnet group.

FIG. 4A is an enlarged view of magnetoresistance element 2. FIG. 4B is a cross-sectional view of magnetoresistance element 2 on line 4B-4B shown in FIG. 4A. FIGS. 5A and 5B show magnetic biases 5M, 6M, 7M at centers 5C, 6C, and 7C of magnets 5, 6, and 7 constituting magnet group 5P, respectively.

As shown in FIG. 4A, magnetoresistance element 2 has patterns 2A, 2B, 2C, and 2D each having a meandering shape having plural folded portions. As shown in FIG. 4A, patterns 2A, 2B, 2C, and 2D have straight portions 2E, 2F, 2G, and 2H having the most length, respectively. Straight portion 2E and straight portion 2G are shifted from each other by 90 degrees. Straight portion 2F and straight portion 2H are shifted from each other by 90 degrees. Straight portion 2G and straight portion 2F are shifted from each other by 90 degrees. Straight portion 2E and straight portion 2H are shifted from each other by 90 degrees. As shown in FIGS. 4A, 5A, and 5B, straight portions 2E, 2F, 2G, and 2H form 45 degrees with respect to a direction of magnetic bias 5M of magnet 5. Respective relationships between the patterns of other magnetoresistance elements 3 and 4 constituting magnetoresistance element group 2P and magnets 6 and 7 corresponding to magnetoresistance elements 3 and 4 is also the same as a relationship between the pattern of magnetoresistance element 2 and magnet 5 corresponding to magnetoresistance element 2. This configuration secures the reliability of a sensing function of magnetic sensor 95.

As shown in FIG. 4A, positioning portion 9 is preferably provided on surface 1A of board 1. Positioning portion 9 positions corner 5T (6T or 7T) of magnet 5 (6 or 7) at positions corresponding to corners 5T (6T or 7T) of magnet 5 (6 or 7). When the position of magnet 5 deviates from a predetermined position, the direction of magnetic bias 5M applied from magnet 5 deviates from a predetermined direction, accordingly deteriorating the reliability. Therefore, magnet 5 is disposed while maintaining a position relationship between corners 5T (6T or 7T) of magnet 5 (6 or 7) and positioning portion 9 with, e.g. an optical microscope to reduce the positional deviation of magnet 5, hence improving the reliability. Positioning portion 9 is preferably made of metal. Positioning portion 9 is preferably made of material identical to material of wiring 10 extending from magnetoresistance element group 2P. This configuration is preferable in terms of costs since positioning portion 9 can be formed using the same process as a process for forming wiring 10. The above description regarding magnet 5 can be applied to other magnets 6 and 7.

As shown in FIG. 4B, magnet 5 is preferably disposed on magnetoresistance element 2 with adhesive 8 made of a thermosetting adhesive or an UV-curable adhesive. Adhesive 8 preferably covers a portion of a side surface of magnet 5 connected to a surface of magnet facing magnetoresistance element 2. When the position of magnet 5 deviates from a predetermined position, the position or direction of magnetic bias 5M applied from magnet 5 deviates from a predetermined position or direction, thus deteriorating the reliability. Therefore, adhesive 8 made of a thermosetting adhesive or an UV-curable adhesive is cured after confirming the position of magnet 5 to reduce the positional deviation of magnet 5, thus improving the reliability. The above description regarding magnet 5 can be applied to other magnets 6 and 7.

In addition, as shown in FIG. 4B, protective film 17 including a silicon oxide film or a fluororesin film is disposed on magnetoresistance element group 2P. Adhesive 8 may be directly attached to magnetoresistance element group 2P. However, protective film 17 preventing adhesive 8 from contacting magnetoresistance element group 2P secures the reliability of magnetic sensor 95.

Magnetoresistance elements 2, 3, and 4 constituting magnetoresistance element group 2P are artificial lattice films including a magnetic layer including Ni, Co, and Fe and a non-magnetic layer including Cu placed on the magnetic layer. Each of the magnetoresistance elements is preferably an anisotropic magnetoresistance element having a resistance value changing depending on an intensity of a magnetic field in a particular direction and not depending on an intensity of a magnetic field in a direction other than the particular direction.

Magnetoresistance element group 2P may be disposed on surface 1A of board 1 through a base film, such as a silicon oxide film.

As shown in FIGS. 5A and 5B, a direction of the magnetic field (magnetic bias 6M) at center 6C of magnet 6 is preferably parallel to a direction of the magnetic field (magnetic bias 7M) at center 7C of magnet 7 while a direction of the magnetic field (magnetic bias 5M) at center 5C of magnet 5 is preferably perpendicular to a direction of the magnetic field (magnetic bias 6M) at center 6C of magnet 6. Magnets 5, 6, and 7 are preferably disposed at sufficient intervals between them such that the magnetic fields formed by magnets 5, 6, and 7 do not interfere with each other. This configuration allows a rotation angle of a measurement target to be detected accurately.

As shown in FIG. 5A, the direction of the magnetic field (magnetic bias 5M) at center 5C of magnet 5 faces the direction of the magnetic field (magnetic bias 6M) at center 6C of magnet 6. That is, the magnetic field (magnetic bias 5M) at center 5C of magnet 5 is opposite to the magnetic field (magnetic bias 6M) at center 6C of magnet 6. In addition, as shown in FIG. 5B, the magnetic field (magnetic bias 5M) at center 5C of magnet 5 may face outward while the magnetic field (magnetic bias 6M) at center 6C of magnet 6 may face outward. In order to realize the magnetic fields as shown in FIG. 5A, magnets 5, 6, and 7 are magnetized independently. On the other hand, in order to realize the magnetic fields as shown in FIG. 5B, all magnets 5, 6, and 7 are magnetized at once.

As shown in FIG. 1, processing circuit 51 that processes a signal output from magnetoresistance element group 2P is preferably disposed on surface 1A of board 1 between magnetoresistance element 3 and magnetoresistance element 4. Processing circuit 51 can amplify, for example, a signal output from magnetoresistance element group 2P. Processing circuit 51 is disposed in a space between magnetoresistance element 3 and magnetoresistance element 4 to reduce the entire size of magnetic sensor 95.

Magnets 5, 6, and 7 are preferably made of resin and rare earth magnet powder dispersed in the resin. The resin is preferably a thermosetting resin while the rare earth magnet powder is preferably SmFeN magnet powder. SmFeN has a characteristic allowing the resin to be easily molded and thus has an advantageous effect in terms of the manufacturing process.

As shown in FIG. 2, sizes of magnetoresistance element 3 and magnetoresistance element 4 are preferably smaller than a size of magnetoresistance element 2. As shown in FIG. 4A, magnetoresistance element 2 has four patterns 2A to 2D each having a meandering shape. The straight portions having the most length in adjacent two patterns of patterns 2A to 2D are perpendicular to each other. On the other hand, each of magnetoresistance element 3 and magnetoresistance element 4 has two patterns having a meandering shape. The straight portions having the most length in the two patterns are preferably perpendicular to each other. However, each of magnetoresistance element 3 and magnetoresistance element 4 may further has two dummy patterns having a meandering shape and, that is, may have four patterns having a meandering shape in total as in magnetoresistance element 2.

Exemplary Embodiment 2

Figure 6:
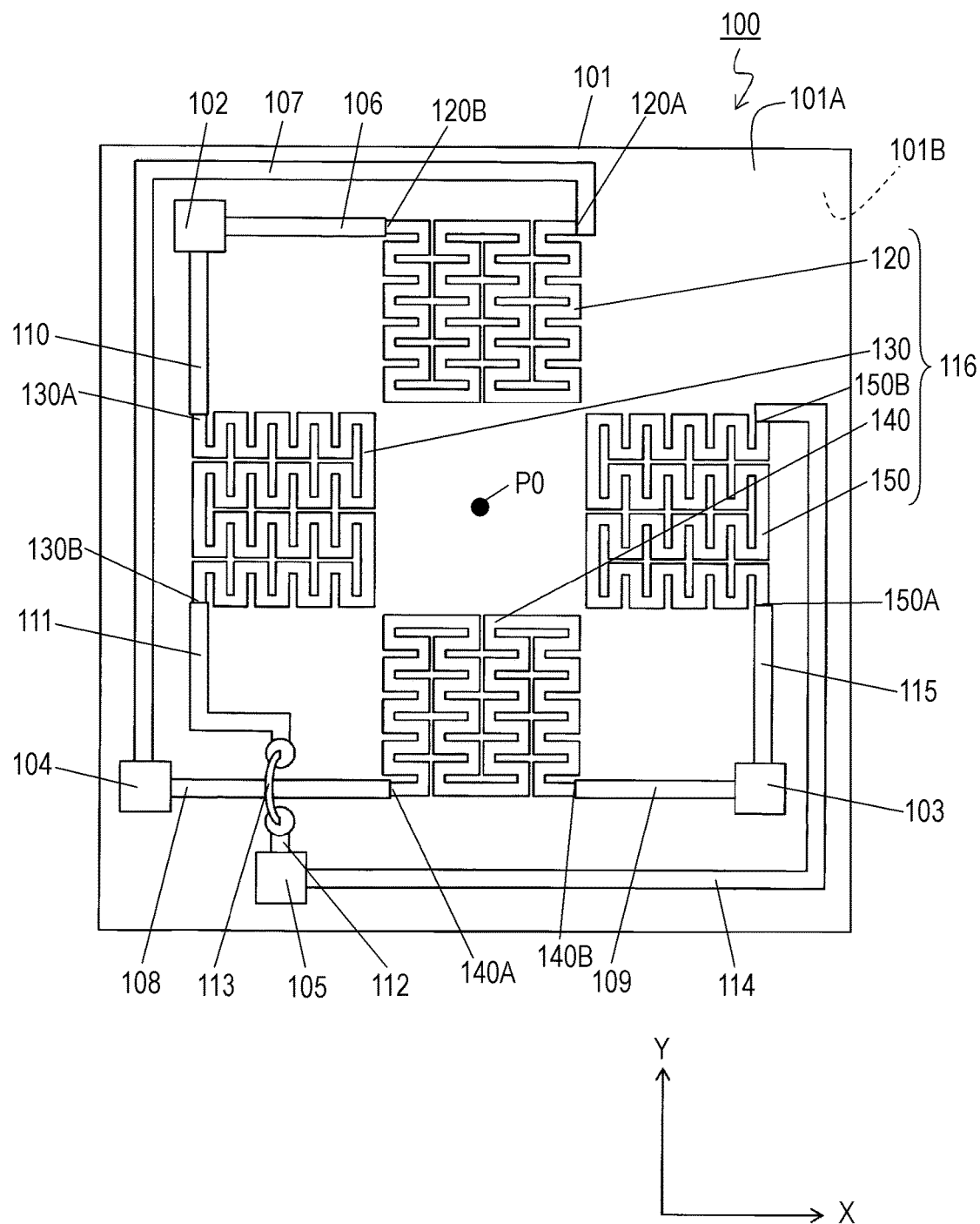
FIG. 6 is a plan view of a magnetic sensor according to Exemplary Embodiment 2.

FIG. 6 is a schematic diagram of magnetic sensor 100 according to Exemplary Embodiment 2. Magnetic sensor 100 includes board 101 and magnetoresistance element group 116 disposed on board 101. Board 101 is made of silicon, and has a plate shape having surface 101A and surface 101B opposite to surface 101A. Magnetoresistance element group 116 includes magnetoresistance elements 120, 130, 140, and 150. Applying electrode 102, ground electrode 103, output electrodes 104 and 105, and wirings 106 to 115 are disposed on surface 101A of board 101. Jumper line 113 electrically connects wiring 111 to wiring 112 over wiring 108. Jumper line 113 is electrically insulated from wiring 108.

Magnetoresistance element 120 has ends 120A and 120B. Magnetoresistance element 130 has ends 130A and 130B. Magnetoresistance element 140 has ends 140A and 140B. Magnetoresistance element 150 has ends 150A and 150B. Magnetoresistance elements 120, 130, 140, and 150 exhibits a magnetoresistance effect in which, when a magnetic field is applied, respective resistance values between ends 120A, 130A, 140A, and 150A and ends 120B, 130B, 140B, and 150B change. Magnetoresistance element 120, magnetoresistance element 130, magnetoresistance element 140, and magnetoresistance element 150 are, for example, giant magnetoresistance elements. More specifically, magnetoresistance elements 120, 130, 140, and 150 are made of artificial lattice films including a magnetic layer containing Ni, Co, and Fe and a non-magnetic layer placed containing Cu on the magnetic layer.

Applying electrode 102 is electrically connected to magnetoresistance element 120 through wiring 106, and is electrically connected to magnetoresistance element 130 through wiring 110. Ground electrode 103 is electrically connected to end 140B of magnetoresistance element 140 through wiring 109, and is electrically connected to end 150A of magnetoresistance element 150 through wiring 115. Output electrode 104 is electrically connected to end 120A of magnetoresistance element 120 through wiring 107, and is electrically connected to end 140A of magnetoresistance element 140 through wiring 108. Output electrode 105 is electrically connected to end 130B of magnetoresistance element 130 through wiring 111, wiring 112, and jumper line 113, and is electrically connected to end 150B of magnetoresistance element 150 through wiring 114. Magnetoresistance element 120 and magnetoresistance element 140 constitute a half-bridge circuit. Magnetoresistance element 130 and magnetoresistance element 150 constitute a half-bridge circuit.

In FIG. 6, an X axis and a Y axis which are parallel to surface 101A of board 101 and are perpendicular to each other are defined. In FIG. 6, a direction of the X axis is a horizontal direction, and a direction of the Y axis is a vertical direction. A positive direction of the X axis is defined as forward direction X1, and a negative direction of the X axis opposite to the positive direction of the X axis, that is, a direction of the X axis opposite to forward direction X1 is defined as backward direction X2. A positive direction of the Y axis is defined as forward direction Y1, and a negative direction of the Y axis opposite to the positive direction of the Y axis, that is, a direction of the Y axis opposite to forward direction Y1 is defined as backward direction Y2.

FIGS. 7, 8, 9, and 10 are plan views of magnetoresistance elements 120, 130, 140, and 150 shown in FIG. 6, respectively. In FIGS. 7, 8, 9, and 10, ratios of the enlarged sizes in the vertical direction and the horizontal direction to those in FIG. 6 change in order to make the components easily recognized.

Figure 7:
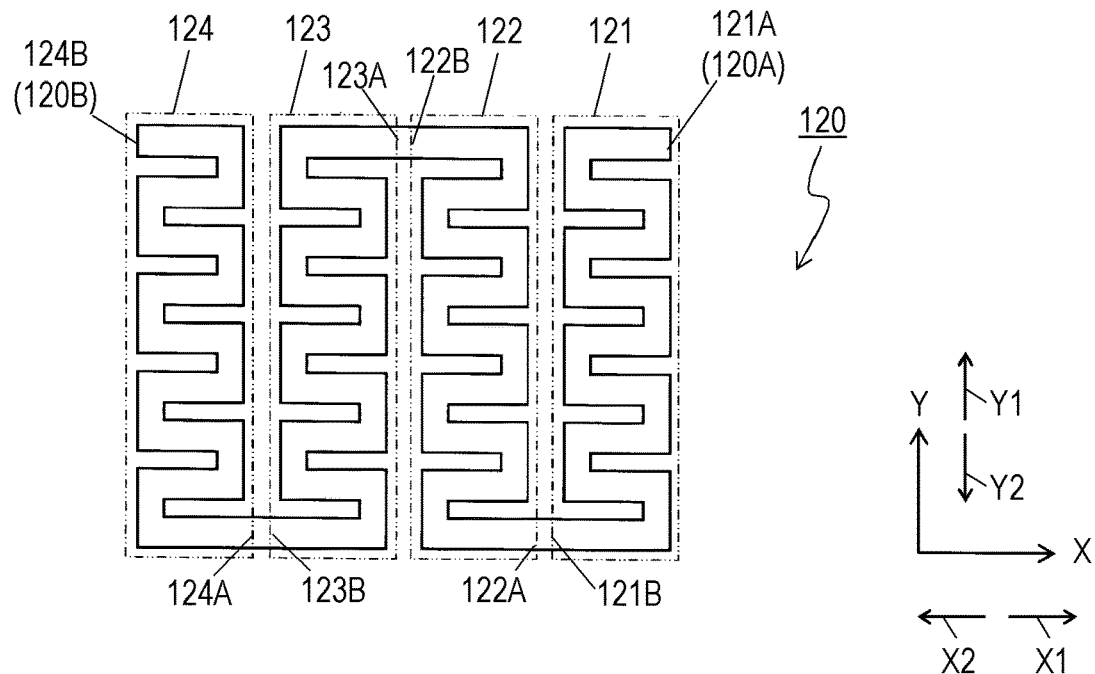
FIG. 7 is a plan view of a magnetoresistance element of the magnetic sensor according to Embodiment 2.

As shown in FIG. 7, magnetoresistance element 120 includes meandering portions 121, 122, 123, and 124 which are connected in series in this order in a region from end 120A to end 120B. Meandering portions 121, 122, 123, and 124 are made of patterns having a magnetoresistance effect. End 120A of magnetoresistance element 120 is positioned at a corner of magnetoresistance element 120 in forward direction X1 and forward direction Y1. End 120B of magnetoresistance element 120 is positioned at a corner of magnetoresistance element 120 in backward direction X2 and forward direction Y1.

End 121A of meandering portion 121 is end 120A of magnetoresistance element 120. Meandering portion 121 extends in backward direction X2 from end 121A (120A) located at a corner of meandering portion 121 (magnetoresistance element 120) in forward direction X1 and forward direction Y1 and is positioned at an end in the upper right direction in the drawing, further extends in backward direction Y2, further extends in forward direction X1, and further extends in backward direction Y2. Similarly, meandering portion 121 extends in backward direction X2, backward direction Y2, forward direction X1, and backward direction Y2 in this order and reaches end 121B. As a result, meandering portion 121 extends from end 121A to end 121B in backward direction Y2 while being folded in forward direction X1 and backward direction X2. End 121B of meandering portion 121 is positioned at a corner of meandering portion 121 in backward direction X2 and backward direction Y2.

End 122A of meandering portion 122 is connected to end 121B of meandering portion 121. Meandering portion 122 extends in backward direction X2 from end 122A located at a corner of meandering portion 122 in forward direction X1 and backward direction Y2, further extends in forward direction Y1, further extends in forward direction X1, and further extends in forward direction Y1. Meandering portion 122 extends in backward direction X2, forward direction Y1, forward direction X1, and forward direction Y1 in this order and reaches end 122B. As a result, meandering portion 122 extends from end 122A to end 122B in forward direction Y1 while being folded in forward direction X1 and backward direction X2. End 122B of meandering portion 122 is positioned at a corner of meandering portion 122 in backward direction X2 and forward direction Y1.

End 123A of meandering portion 123 is connected to end 122B of meandering portion 122. Meandering portion 123 extends in backward direction X2 from end 123A located at a corner of meandering portion 123 in forward direction X1 and forward direction Y1, further extends in backward direction Y2, further extends in forward direction X1, and further extends in backward direction Y2. Meandering portion 123 extends in backward direction X2, backward direction Y2, forward direction X1, and backward direction Y2 in this order and reaches end 123B. As a result, meandering portion 123 extends from end 123A to end 123B in backward direction Y2 while being folded in forward direction X1 and backward direction X2. End 123B of meandering portion 123 is positioned at a corner of meandering portion 123 in backward direction X2 and backward direction Y2.

End 124A of meandering portion 124 is connected to end 123B of meandering portion 123. Meandering portion 124 extends in backward direction X2 from end 124A located at a corner of meandering portion 124 in forward direction X1 and backward direction Y2, further extends in forward direction Y1, further extends in forward direction X1, and further extends in forward direction Y1. Meandering portion 124 extends in backward direction X2, forward direction Y1, forward direction X1, and forward direction Y1 in this order and reaches end 124B. As a result, meandering portion 124 extends from end 124A to end 124B in forward direction Y1 while being folded in forward direction X1 and backward direction X2. End 124B of meandering portion 124 is positioned at a corner of meandering portion 124 in backward direction X2 and forward direction Y1. End 124B of meandering portion 124 is end 120B which is positioned at a corner of magnetoresistance element 130 in backward direction X2 and forward direction Y1.

Meandering portion 123 has the same shape as meandering portion 121. Meandering portion 124 has the same shape as meandering portion 122. The shape of meandering portion 121 is reverse to the shape of meandering portion 122, but is the same as the shape of meandering portion 122. That is, meandering portions 121, 122, 123, and 124 have the same shape. As in meandering portions 121, 122, 123, and 124, a pattern which extends in forward direction Y1 or backward direction Y2 while being folded in forward direction X1 and backward direction X2 is defined as a first type pattern. Magnetoresistance element 120 has a pattern in which meandering portions 121, 122, 123, and 124 which are the first type patterns are continuously disposed in this order in backward direction X2.

Figure 8:
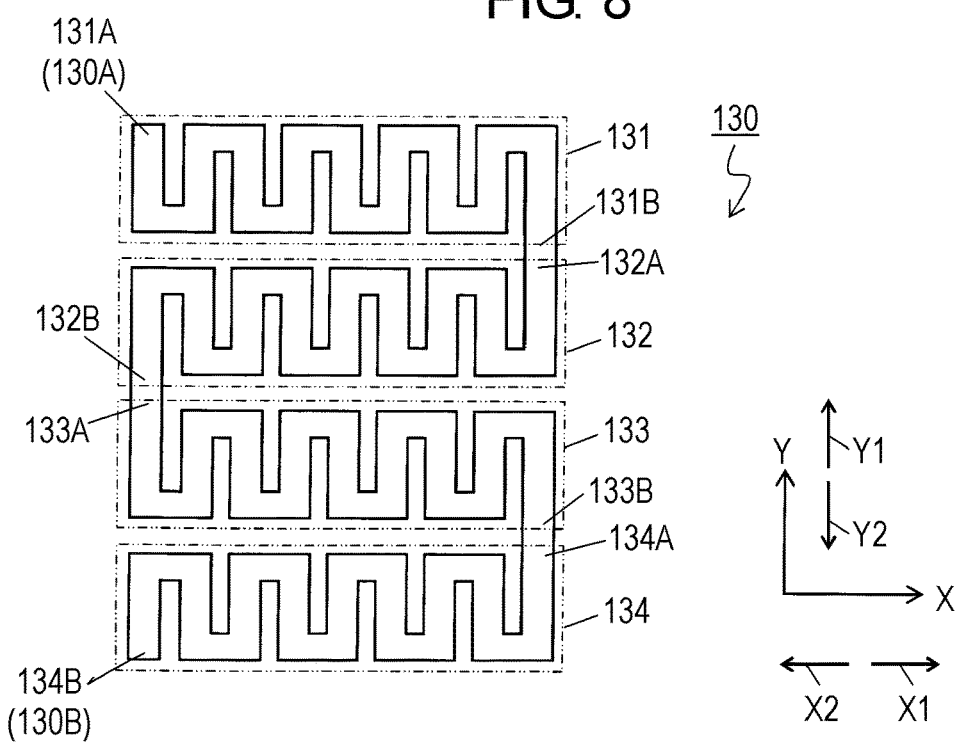
FIG. 8 is a plan view of a magnetoresistance element of the magnetic sensor according to Embodiment 2.

As shown in FIG. 8, magnetoresistance element 130 has meandering portions 131, 132, 133, and 134 which are connected in series in this order in a region from end 130A to end 130B. Meandering portions 131, 132, 133, and 134 are made of patterns exhibiting a magnetoresistance effect. End 130A of magnetoresistance element 130 is positioned at a corner of magnetoresistance element 130 in backward direction X2 and forward direction Y1. End 120B of magnetoresistance element 120 is positioned at a corner of magnetoresistance element 120 in backward direction X2 and backward direction Y2.

End 131A of meandering portion 131 is end 130A of magnetoresistance element 130. Meandering portion 131 extends in backward direction Y2 from end 131A (130A) located at a corner of meandering portion 131 (magnetoresistance element 130) in backward direction X2 and forward direction Y1 and is positioned at an end in the upper left direction in the drawing, further extends in forward direction X1, further extends in forward direction Y1, and further extends in forward direction X1. Meandering portion 131 extends in backward direction Y2, forward direction X1, forward direction Y1, and forward direction X1 in this order and reaches end 131B. As a result, meandering portion 131 extends from end 131A to end 131B in forward direction X1 while being folded in forward direction Y1 and backward direction Y2. End 131B of meandering portion 131 is positioned at a corner of meandering portion 131 in forward direction X1 and backward direction Y2.

End 132A of meandering portion 132 is connected to end 131B of meandering portion 131. Meandering portion 132 extends in backward direction Y2 from end 132A located at a corner of meandering portion 132 in forward direction X1 and forward direction Y1, further extends in backward direction X2, further extends in forward direction Y1, and further extends in backward direction X2. Meandering portion 132 extends in backward direction Y2, backward direction X2, forward direction Y1, and backward direction X2 in this order and reaches end 132B. As a result, meandering portion 132 extends from end 132A to end 132B in backward direction X2 while being folded in forward direction Y1 and backward direction Y2. End 132B of meandering portion 132 is positioned at a corner of meandering portion 132 in backward direction X2 and backward direction Y2.

End 133A of meandering portion 133 is connected to end 132B of meandering portion 132. Meandering portion 133 extends in backward direction Y2 from end 133A located at a corner of meandering portion 133 in backward direction X2 and forward direction Y1, further extends in forward direction X1, further extends in forward direction Y1, and further extends in forward direction X1. Likewise, meandering portion 133 extends in backward direction Y2, forward direction X1, forward direction Y1, and forward direction X1 in this order and reaches end 133B. As a result, meandering portion 133 extends from end 133A to end 133B in forward direction X1 while being folded in forward direction Y1 and backward direction Y2 from end 133A. End 133B of meandering portion 133 is positioned at a corner of meandering portion 133 in forward direction X1 and backward direction Y2.

End 134A of meandering portion 134 is connected to end 133B of meandering portion 133. Meandering portion 134 extends in backward direction Y2 from end 134A located at a corner of meandering portion 134 in forward direction X1 and forward direction Y1, further extends in backward direction X2, further extends in forward direction Y1, and further extends in backward direction X2. Meandering portion 134 extends in backward direction Y2, backward direction X2, forward direction Y1, and backward direction X2 in this order and reaches end 134B. As a result, meandering portion 134 extends from end 134A to end 134B in backward direction X2 while being folded in forward direction Y1 and backward direction Y2. End 134B of meandering portion 134 is positioned at a corner of meandering portion 134 in backward direction X2 and backward direction Y2. End 134B of meandering portion 134 is end 130B which is positioned at a corner of magnetoresistance element 130 in backward direction X2 and backward direction Y2.

Meandering portion 133 has the same shape as that of meandering portion 131. Meandering portion 134 has the same shape as that of meandering portion 132. The shape of meandering portion 131 is reverse to the shape of meandering portion 132, but is the same as meandering portion 132. That is, meandering portions 131, 132, 133, and 134 have the same shape. As in meandering portions 131, 132, 133, and 134, a pattern which extends in forward direction X1 or backward direction X2 while being folded in forward direction Y1 and backward direction Y2 is defined as a second type pattern. Magnetoresistance element 130 has a pattern in which meandering portions 131, 132, 133, and 134 which are the second type patterns are continuously disposed in this order in backward direction Y2.

Figure 9:
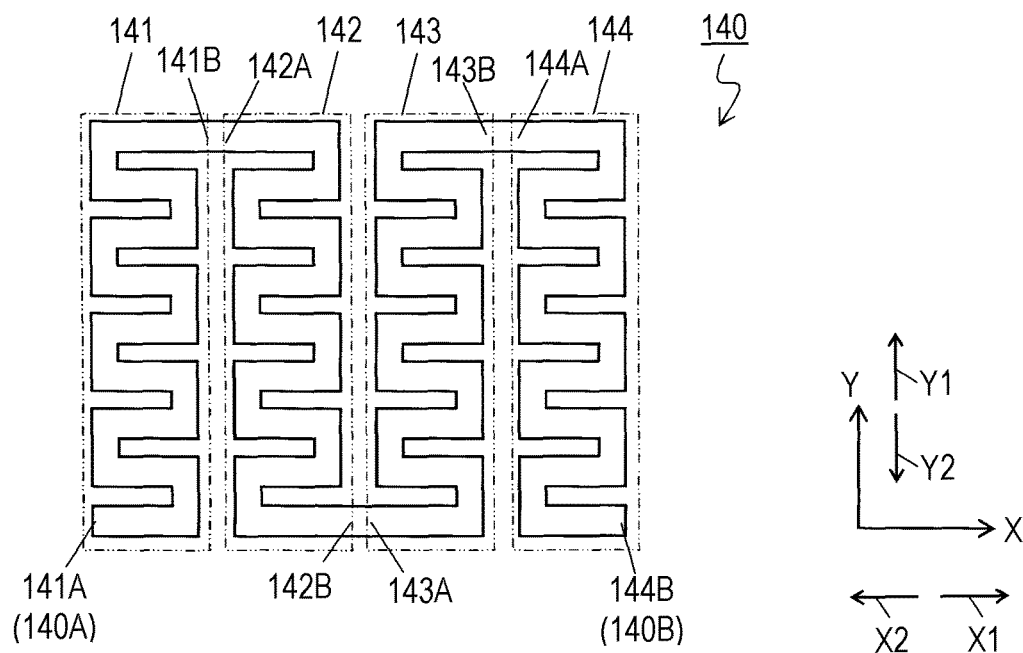
FIG. 9 is a plan view of a magnetoresistance element of the magnetic sensor according to Embodiment 2.

As shown in FIG. 9, magnetoresistance element 140 has meandering portions 141, 142, 143, and 144 which are connected in series in this order in a region from end 140A to end 140B. Meandering portions 141, 142, 143, and 144 are made of patterns exhibiting a magnetoresistance effect. End 140A of magnetoresistance element 140 is positioned at a corner of magnetoresistance element 140 in backward direction X2 and backward direction Y2. End 140B of magnetoresistance element 140 is positioned at a corner of magnetoresistance element 140 in forward direction X1 and backward direction Y2.

End 141A of meandering portion 141 is end 140A of magnetoresistance element 140. Meandering portion 141 extends in forward direction X1 from end 141A (140A) located at a corner of meandering portion 141 (magnetoresistance element 140) in backward direction X2 and backward direction Y2 and is positioned at an end in the upper left direction in the drawing, further extends in forward direction Y1, further extends in backward direction X2, and further extends in forward direction Y1. Meandering portion 141 thus extends in forward direction X1, forward direction Y1, backward direction X2, and forward direction Y1 in this order and reaches end 141B. As a result, meandering portion 141 extends from end 141A to end 141B in forward direction Y1 while being folded in forward direction X1 and backward direction X2. End 141B of meandering portion 141 is positioned at a corner of meandering portion 141 in forward direction X1 and forward direction Y1.

End 142A of meandering portion 142 is connected to end 141B of meandering portion 141. Meandering portion 142 extends in forward direction X1 from end 142A located at a corner of meandering portion 142 in backward direction X2 and forward direction Y1, further extends in backward direction Y2, further extends in backward direction X2, and further extends in backward direction Y2. Meandering portion 142 thus extends in forward direction X1, backward direction Y2, backward direction X2, and backward direction Y2 in this order and reaches end 142B. As a result, meandering portion 142 extends from end 142A to end 142B in backward direction Y2 while being folded in forward direction X1 and backward direction X2.

End 143A of meandering portion 143 is connected to end 142B of meandering portion 142. Meandering portion 143 extends in forward direction X1 from end 143A located at a corner of meandering portion 143 in backward direction X2 and backward direction Y2, further extends in forward direction Y1, further extends in backward direction X2, and further extends in forward direction Y1. Meandering portion 143 thus extends in forward direction X1, forward direction Y1, backward direction X2, and forward direction Y1 in this order and reaches end 143B. As a result, meandering portion 143 extends from end 143A to end 143B in forward direction Y1 while being folded in forward direction X1 and backward direction X2.

End 144A of meandering portion 144 is connected to end 143B of meandering portion 143. Meandering portion 144 extends in forward direction X1 from end 144A located at a corner of meandering portion 144 in backward direction X2 and forward direction Y1, further extends in backward direction Y2, further extends in backward direction X2, and further extends in backward direction Y2. Meandering portion 144 thus extends in forward direction X1, backward direction Y2, backward direction X2, and backward direction Y2 in this order and reaches end 144B. As a result, meandering portion 144 extends from end 144A to end 144B in backward direction Y2 while being folded in forward direction X1 and backward direction X2. End 144B of meandering portion 144 is end 140B which is positioned at a corner of magnetoresistance element 140 in forward direction X1 and backward direction Y2.

Meandering portion 143 has the same shape as that of meandering portion 141. Meandering portion 144 has the same shape as that of meandering portion 142. The shape of meandering portion 141 is reverse to the shape of meandering portion 142, but is the same as meandering portion 142. That is, meandering portions 141, 142, 143, and 144 have the same shape. As in magnetoresistance element 120, magnetoresistance element 140 has a pattern in which meandering portions 141, 142, 143, and 144, which are the first type patterns, are continuously disposed in this order in forward direction X1.

Figure 10:
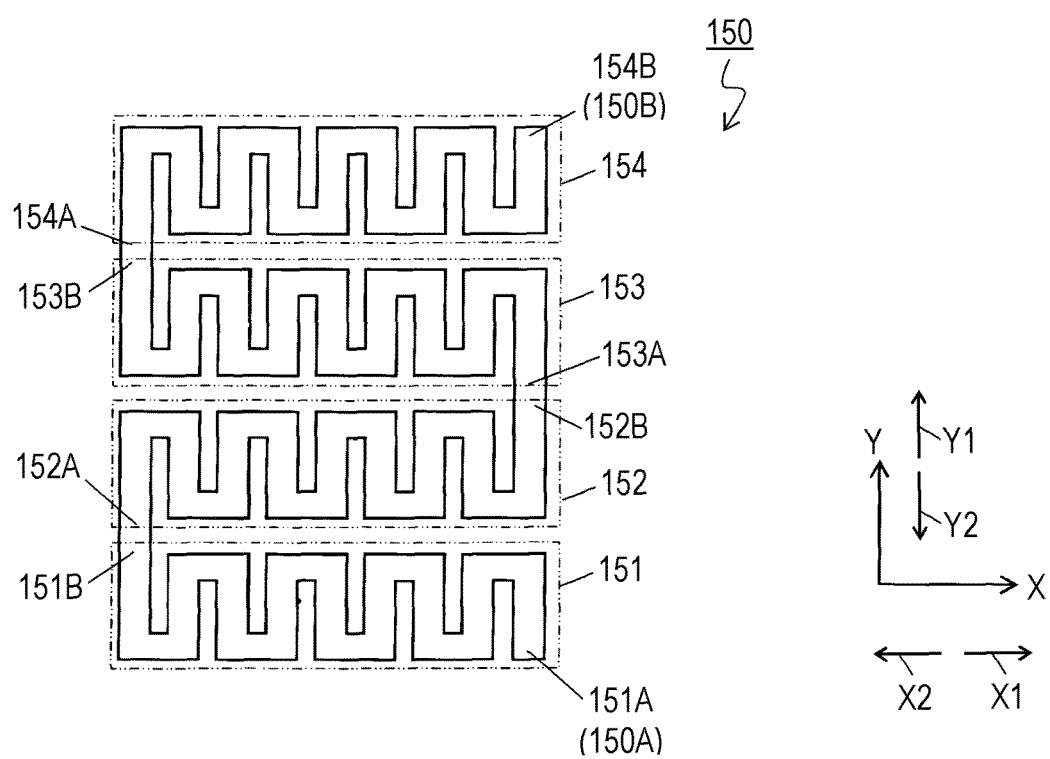
FIG. 10 is a plan view of a magnetoresistance element of the magnetic sensor according to Embodiment 2.

As shown in FIG. 10, magnetoresistance element 150 has meandering portions 151, 152, 153, and 154 which are connected in series in this order in a region from end 150A to end 150B. Meandering portions 151, 152, 153, and 154 are made of patterns exhibiting a magnetoresistance effect. End 150A of magnetoresistance element 150 is positioned at a corner of magnetoresistance element 150 in forward direction X1 and backward direction Y2. End 150B of magnetoresistance element 150 is positioned at a corner of magnetoresistance element 150 in forward direction X1 and forward direction Y1.

End 151A of meandering portion 151 is end 150A of magnetoresistance element 150. Meandering portion 151 extends in forward direction Y1 from end 151A (150A) located at a corner of meandering portion 151 (magnetoresistance element 150) in forward direction X1 and backward direction Y2 and is positioned at an end in the lower right direction in the drawing, further extends in backward direction X2, further extends in backward direction Y2, and further extends in backward direction X2. Meandering portion 151 thus extends in forward direction Y1, backward direction X2, backward direction Y2, and backward direction X2 in this order and reaches end 151B. As a result, meandering portion 151 extends from end 151A to end 151B in backward direction X2 while being folded in forward direction Y1 and backward direction Y2. End 151B of meandering portion 151 is positioned at a corner of meandering portion 151 in backward direction X2 and forward direction Y1.

End 152A of meandering portion 152 is connected to end 151B of meandering portion 151. Meandering portion 152 extends in forward direction Y1 from end 152A located at a corner of meandering portion 152 in backward direction X2 and backward direction Y2, further extends in forward direction X1, further extends in backward direction Y2, and further extends in forward direction X1. Meandering portion 152 thus extends in forward direction Y1, forward direction X1, backward direction Y2, and forward direction X1 in this order and reaches end 152B. As a result, meandering portion 152 extends from end 152A to end 152B in forward direction X1 while being folded in forward direction Y1 and backward direction Y2. End 152B of meandering portion 152 is positioned at a corner of meandering portion 152 in forward direction X1 and forward direction Y1.

End 153A of meandering portion 153 is connected to end 152B of meandering portion 152. Meandering portion 153 extends in forward direction Y1 from end 153A located at a corner of meandering portion 153 in forward direction X1 and backward direction Y2, further extends in backward direction X2, further extends in backward direction Y2, and further extends in backward direction X2. Meandering portion 153 thus extends in forward direction Y1, backward direction X2, backward direction Y2, and backward direction X2 in this order and reaches end 153B. As a result, meandering portion 153 extends from end 153A to end 153B in backward direction X2 while being folded in forward direction Y1 and backward direction Y2 from end 153A. End 153B of meandering portion 153 is positioned at a corner of meandering portion 153 in backward direction X2 and forward direction Y1.

End 154A of meandering portion 154 is connected to end 153B of meandering portion 153. Meandering portion 154 extends in forward direction Y1 from end 154A located at a corner of meandering portion 154 in backward direction X2 and backward direction Y2, further extends in forward direction X1, further extends in backward direction Y2, and further extends in forward direction X1. Meandering portion 154 thus extends in forward direction Y1, forward direction X1, backward direction Y2, and forward direction X1 in this order and reaches end 154B. As a result, meandering portion 154 extends from end 154A to end 154B in forward direction X1 while being folded in forward direction Y1 and backward direction Y2. End 154B of meandering portion 154 is positioned at a corner of meandering portion 154 in forward direction X1 and forward direction Y1. End 154B of meandering portion 154 is end 150B which is positioned at a corner of magnetoresistance element 150 in forward direction X1 and forward direction Y1.

Meandering portion 153 has the same shape as that of meandering portion 151. Meandering portion 154 has the same shape as that of meandering portion 152. The shape of meandering portion 151 is reverse to that of meandering portion 152, but si the same as meandering portion 152. That is, meandering portions 151, 152, 153, and 154 have the same shape. As in magnetoresistance element 130, magnetoresistance element 150 has a pattern in which meandering portions 151, 152, 153, and 154, which are the second type patterns, are continuously disposed in this order in forward direction Y1.

Magnetoresistance elements 120, 130, 140, and 150 have the same shape and have the same resistance value.

Magnetoresistance elements 120, 130, 140, and 150 are arranged symmetrically to one another with respect to point P0 apart from magnetoresistance elements 120, 130, 140, and 150 by the same distance.

An angular interval between magnetoresistance elements 120 and 130 about point P0, an angular interval between magnetoresistance elements 130 and 140 about point P0, an angular interval between magnetoresistance elements 140 and 150 about point P0, and an angular interval between magnetoresistance elements 150 and 120 about point P0 are 90 degrees.

Figure 11A:
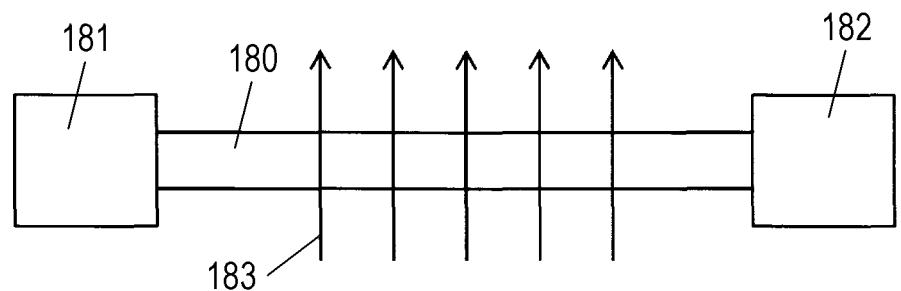
FIG. 11A is a schematic diagram of a magnetoresistance element of the magnetic sensor according to Embodiment 2.
Figure 11B:
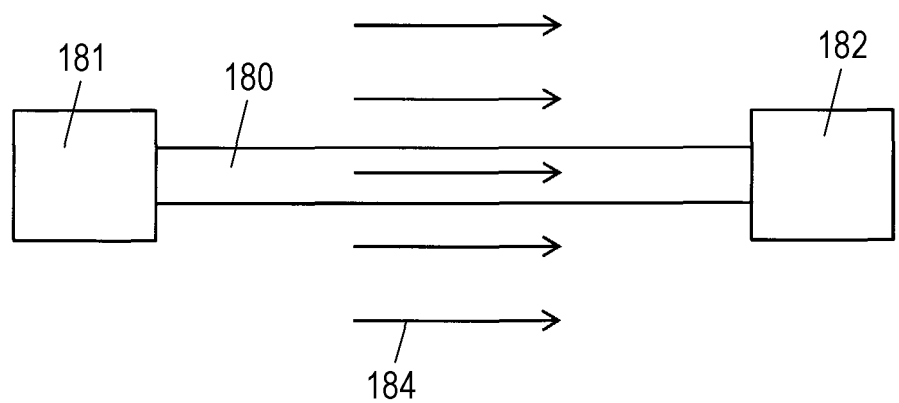
FIG. 11B is a schematic diagram of the magnetoresistance element of the magnetic sensor according to Embodiment 2.

Directions of magnetic fields applied to magnetoresistance elements 120, 130, 140, and 150 and changes in the resistance values of magnetoresistance elements 120, 130, 140, and 150 will be described below. FIGS. 11A and 11B are schematic diagrams of magnetoresistance element 180. Magnetoresistance element 180 corresponds to each of magnetoresistance elements 120, 130, 140, and 150 and is made of the same material as magnetoresistance elements 120, 130, 140, and 150. In FIG. 11A, external magnetic field 183 is applied to magnetoresistance element 180 in a direction perpendicular to a direction of current 1180 flowing through magnetoresistance element 180. In FIG. 11B, external magnetic field 184 is applied to magnetoresistance element 180 in a direction parallel to the direction of current 1180. The direction of current 1180 is a direction in which magnetoresistance element 180 extends.

In FIGS. 11A and 11B, both ends of magnetoresistance element 180 are electrically connected to electrodes 181 and 182 positioned at the ends. Magnetoresistance element 180 is a giant magnetoresistance element.

Figure 12A:
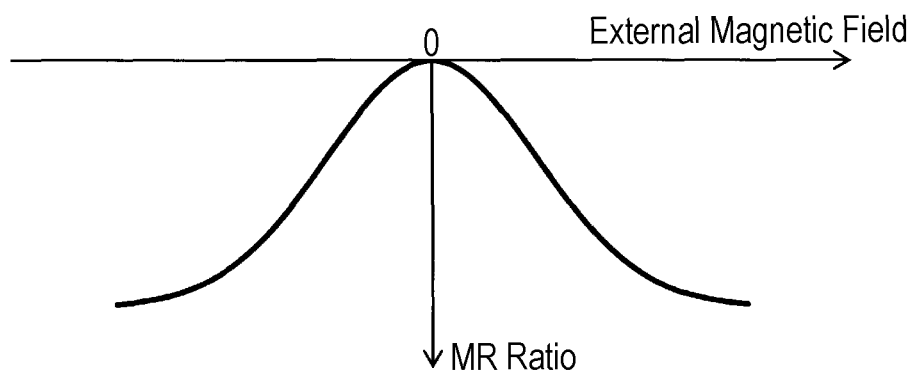
FIG. 12A shows an MR ratio of the magnetoresistance element of the magnetic sensor according to Embodiment 2.
Figure 12B:
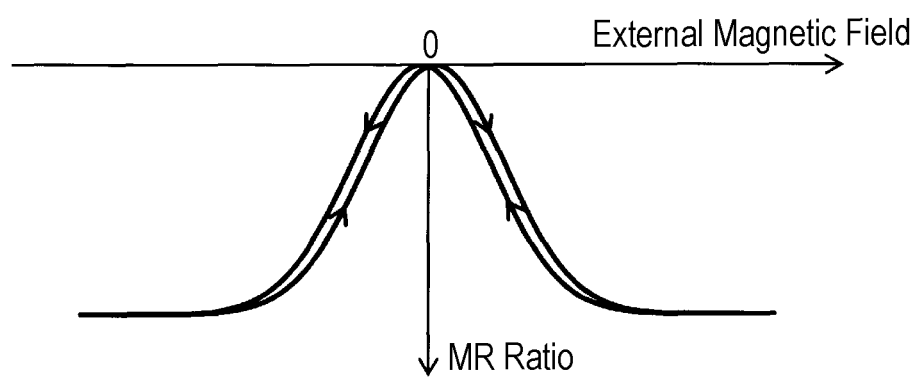
FIG. 12B shows an MR ratio of the magnetoresistance element of the magnetic sensor according to Embodiment 2.

FIG. 12A shows a magneto-resistance (MR) ratio of magnetoresistance element 180 shown in FIG. 11A. FIG. 12B shows an MR ratio of magnetoresistance element 180 shown in FIG. 11B. In FIGS. 12A and 12B, the horizontal axis represents external magnetic fields 183 and 184, and the vertical axis represents the MR ratio. An MR ratio of a magnetic field is defined as a value obtained by dividing a difference between a resistance value of magnetoresistance element 180 having a certain magnetic field applied thereto and a resistance value of magnetoresistance element 180 having no magnetic field applied thereto by the resistance value of magnetoresistance element 180 having no magnetic field applied thereto. When no magnetic field is applied to magnetoresistance element 180, the MR ratio is 0. As applied magnetic fields 183 and 184 increase, the resistance values decrease. Therefore, the MR ratios are negative values. A change of the MR ratio depending on a change of the magnetic field will be referred to as a MR characteristic.

As shown in FIGS. 12A and 12B, when external magnetic fields 183 and 184 are applied to magnetoresistance element 180, the resistance value of magnetoresistance element 180 decreases, the MR ratios which are negative have absolute values thereof increase. The change of the MR ratio shown in FIG. 12B depending on the change of the magnetic field is steeper than that of the MR ratio shown in FIG. 12A. In the MR ratio shown in FIG. 12A, a hysteresis which depends on the direction of the change of the magnetic field does not appear. However, a hysteresis appears in the MR ratio shown in FIG. 12B. Maximum change values of the MR ratios shown in FIGS. 12A and 12B are the same.

As shown in FIGS. 11A, 11B, 12A, and 12B, when external magnetic field 183 perpendicular to the direction of current 1180 is applied to magnetoresistance element 180, the change of the MR ratio depending on the change of magnetic field 183 is relatively gentle in magnetoresistance element 180, and the hysteresis does not appear. When external magnetic field 184 parallel to the direction of current 1180 is applied to magnetoresistance element 180, the change of the MR ratio depending on the change of magnetic field 184 is relatively steep in magnetoresistance element 180, and the hysteresis appears.

When a magnetic field parallel to a pattern of a magnetoresistance element is applied to the magnetoresistance element, the magnetoresistance element may be magnetized.

In the case that a straight portion of a pattern of a magnetoresistance element is long, the hysteresis appears significantly. In the case that a straight portion of a pattern of a magnetoresistance element is short, the hysteresis is reduced or does not appear. Due to this effect, in the case that a giant magnetoresistance element is used as the magnetoresistance element, the hysteresis appears depending on conditions, such as a pattern shape or an applying direction of the external magnetic field.

In magnetoresistance elements 120, 130, 140, and 150, the patterns which have a meandering shape having folded portions are continuously disposed. Therefore, the straight portions of the patterns are relatively short. As a result, in the MR ratios of magnetoresistance elements 120, 130, 140, and 150, the hysteresis does not appear or is extremely small.

In magnetoresistance element 120, the total length of the portions extending in the X axis direction (forward direction X1 or backward direction X2) is 95% to 105% of the total length of the portions extending in the Y axis direction (forward direction Y1 or backward direction Y2). As a result, a difference between a MR characteristic of a case where a direction of an external magnetic field applied to magnetoresistance element 120 is the X axis direction and a MR characteristic of a case where a direction of an external magnetic field applied to magnetoresistance element 120 is the Y axis direction is reduced. In that case that the direction of magnetic field is perpendicular to the X axis direction and the Y axis direction, a difference between the MR characteristics depending on a direction of an external magnetic field applied to magnetoresistance element 120 is reduced, and the MR characteristics are substantially the same without depending on the direction of the external magnetic field.

In the case that the total length of the portions of magnetoresistance element 120 extending in the X axis direction is the same as the total length of the portions of magnetoresistance element 120 extending in the Y axis direction, there is substantially no difference between a MR characteristic of a case where a direction of an external magnetic field applied to magnetoresistance element 120 is the X axis direction and a MR characteristic of a case where a direction of an external magnetic field applied to magnetoresistance element 120 is the Y axis direction. In the case that the X axis is perpendicular to the Y axis, the MR characteristics are substantially the same without depending on a direction of an external magnetic field applied to magnetoresistance element 120.

In magnetoresistance elements 130, 140, and 150, by adjusting the total length of the portions extending in the X axis direction to be 95% to 105% of the total length of the portions extending in the Y axis direction, there is substantially no difference between a MR characteristic of a case where a direction of an external magnetic field is the X axis direction and a MR characteristic of a case where a direction of an external magnetic field is the Y axis direction. Since the X axis is perpendicular to the Y axis, the MR characteristics can be substantially constant without depending on a direction of an applied external magnetic field. By adjusting the total length of the portions of each of magnetoresistance elements 120 to 150 extending in the X axis direction to be the same as the total length of the portions of each of magnetoresistance elements 120 to 150 extending in the Y axis direction, there is substantially no difference between a MR characteristic of a case where a direction of an applied external magnetic field is the X axis direction and a MR characteristic of a case where a direction of an applied external magnetic field is the Y axis direction. The X axis is perpendicular to the Y axis. Therefore, in each of magnetoresistance elements 120 to 150, there is substantially no difference between the MR characteristics depending on a direction of an applied external magnetic field. Magnetoresistance elements 120, 130, 140, and 150 have a constant MR characteristic, that is, magnetic isotropy without depending on an applying direction of an external magnetic field. Magnetoresistance elements 120, 130, 140, and 150 have the same MR characteristic.

Figure 13:
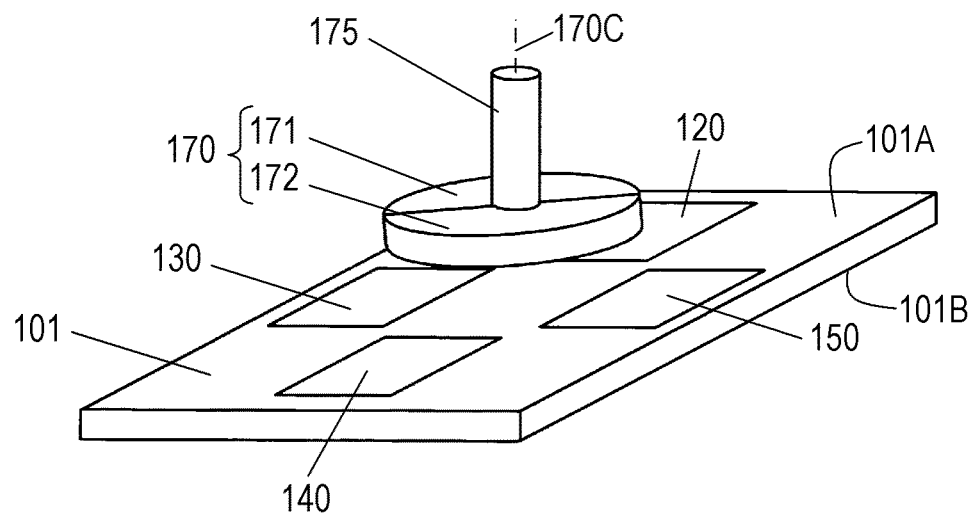
FIG. 13 is a perspective view of the magnetic sensor according to Embodiment 2 for illustrating a method of using the magnetic sensor.
Figure 14:
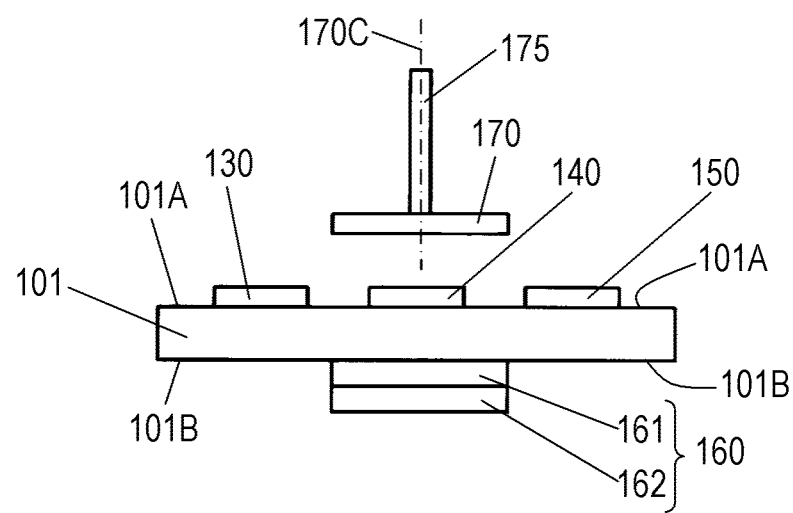
FIG. 14 is a side view of the magnetic sensor according to Embodiment 2 for illustrating a method of using the magnetic sensor.
Figure 15:
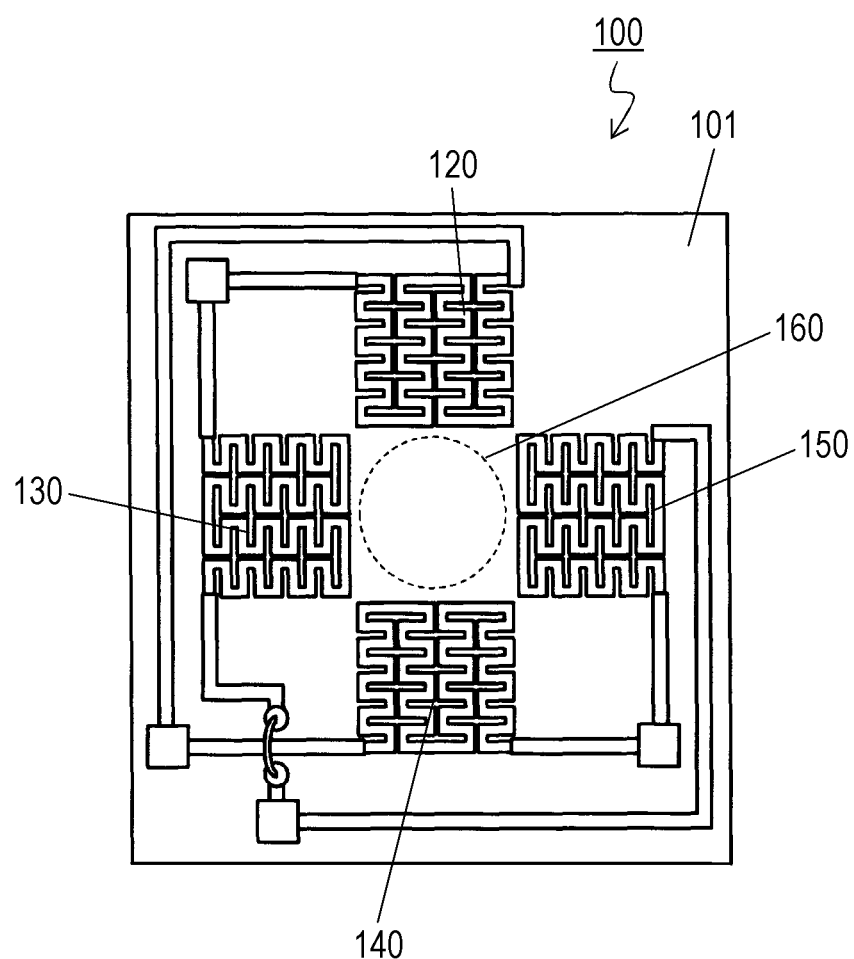
FIG. 15 is a plan view of the magnetic sensor according to Embodiment 2 for illustrating a method of using the magnetic sensor.

FIGS. 13, 14, and 15 are a perspective view, a side view, and a plan view of magnetic sensor 100 according to Embodiment 2, respectively, for illustrating a method of using magnetic sensor 100. FIGS. 13 and 14 only shows the external shapes of magnetoresistance elements 120, 130, 140 and 150 without showing wirings 106 to 112, jumper line 113, and wirings 114 and 115.

Bias magnet 160 is attached onto surface 101B of board 101. Bias magnet 160 has N pole 161 and S pole 162. A direction connecting N pole 161 to S pole 162 is perpendicular to surface 101B of board 101. In FIG. 14, N pole 161 contacts surface 101B. S pole 162 may contact surface 101B. As shown in FIG. 15, in a plan view, bias magnet 160 overlaps none of magnetoresistance elements 120, 130, 140, and 150. In other words, in a plan view, bias magnet 160 does not overlap magnetoresistance element group 116.

Rotating magnet 170 is supported rotatably by rotation shaft 175 such that rotating magnet 170 is rotatable about central axis 170C passing through point P0. Rotating magnet 170 has N pole 171 and S pole 172. A line connecting N pole 171 to S pole 172 is parallel to surface 101A of board 101.

A composite magnetic field of a magnetic field applied from bias magnet 160 and a magnetic field applied from rotating magnet 170 is applied to magnetoresistance elements 120, 130, 140, and 150. Rotating magnet 170 rotates about rotation shaft 175 (central axis 170C) at a rotation period. The absolute value of an intensity of a magnetic field at one point on board 101 of magnetic sensor 100 changes at the rotation period. As described above, magnetoresistance elements 120, 130, 140, and 150 have magnetic isotropy and have resistance values which change depending on the absolute value of the magnetic field intensity. Therefore, these resistance values change at the rotation period at which rotating magnet 170 rotates once. In that case that a change in the resistance value of magnetoresistance element 120 depending on the rotation angle of rotating magnet 170 is approximate to a sine wave, the resistance values of magnetoresistance elements 120 and 140 change with a phase shift of 180 degrees and the resistance values of magnetoresistance elements 130 and 150 also change with a phase shift of 180 degrees. Further, the resistance values of magnetoresistance elements 120 and 130 change with a phase shift of 90 degrees.

In the case that a voltage is applied between applying electrode 102 and ground electrode 103, output electrode 104 generates a voltage depending on changes in the resistance values of magnetoresistance elements 120 and 140. Output electrode 105 generates a voltage depending on changes in the resistance values of magnetoresistance elements 130 and 150. The phase difference between the changes in the resistance values of magnetoresistance elements 120 and 140 is 180 degrees. Therefore, an output from output electrode 104 is substantially twice that of a magnetic sensor which outputs a voltage based on the change in only the resistance value of magnetoresistance element 120 or only the resistance value of magnetoresistance element 140. Further, this output is a sine wave having one cycle in which rotating magnet 170 rotates once. The phase difference between the changes in the resistance values of magnetoresistance elements 130 and 150 is 180 degrees. Therefore, an output from output electrode 105 is substantially twice that of a magnetic sensor which outputs a voltage based on the change in only the resistance value of magnetoresistance element 130 or only the resistance value of magnetoresistance element 150. Further, this output is a sine wave having one cycle in which rotating magnet 170 rotates once. Further, the output from output electrode 104 and the output from output electrode 105 have a phase difference of 90 degrees.

One output of the sine wave depends on corresponding two angles other than 90 degrees and 270 degrees. Accordingly, the rotation angle of rotating magnet 170 can be identified based on the outputs from output electrodes 104 and 105 having a phase difference of 90 degrees. That is, magnetic sensor 100 can obtain the rotation angle of rotating magnet 170. A rotation angle of a rotating object can be obtained by mechanically connecting the object to rotating magnet 170 and measuring a rotation angle of rotating magnet 170.

The usage method shown in FIGS. 13 to 15 is just an example, and other usage methods may be used.

In accordance with the embodiments, magnetoresistance element group 116 includes magnetoresistance elements 120, 130, 140, and 150. However, magnetoresistance element group 116 may include only magnetoresistance elements 120 and 130 without magnetoresistance elements 140 and 150. In this case, in magnetic sensor 100, for example, resistors which form a bridge circuit with magnetoresistance elements 120 and 130 may be disposed instead of magnetoresistance elements 140 and 150. In this case, outputs corresponding to a rotation angle of rotating magnet 170 can be obtained from output electrodes 104 and 105.

Magnetic sensor 100 includes board 101 and magnetoresistance element group 116 and may further include bias magnet 160. Magnetic sensor 100 includes board 101 and magnetoresistance element group 116 and may further include rotating magnet 170 without bias magnet 160. Magnetic sensor 100 includes board 101 and magnetoresistance element group 116 and may further include bias magnet 160 and rotating magnet 170.

In the embodiments, the X axis is perpendicular to the Y axis. However, the X axis direction may be inclined at an angle other than 90 degrees with respect to the Y axis direction without being parallel to a direction of the Y axis. Forward direction X1 and backward direction X2 which are parallel to surface 101A of board 101 are opposite to each other. Forward direction Y1 and backward direction Y2 which are parallel to surface 101A of board 101 are opposite to each other. Forward direction X1 and backward direction X2 are perpendicular to forward direction Y1 and backward direction Y2. Forward direction X1 and backward direction X2 may be inclined at an angle other than 90 degrees with respect to forward direction Y1 and backward direction Y2 without being parallel to forward direction Y1 and backward direction Y2.

Board 101 may be made of an aluminum board instead of a silicon board.

In the embodiments, magnetoresistance elements 120, 130, 140, and 150 have the same resistance value and have the same MR characteristic. Therefore, a rotation angle can be easily obtained based on output voltages from output electrodes 104 and 105. However, magnetoresistance elements 120 to 150 may have at least either the same resistance value or the same MR characteristic. That is, magnetoresistance elements 120 to 150 may have the same resistance value and different MR characteristics. Alternatively, magnetoresistance elements 120 to 150 may have the same MR characteristic and different resistance values.

In the embodiments, magnetoresistance elements 120, 130, 140, and 150 have the same shape. Therefore, the MR characteristics can be same. Further, magnetoresistance elements 120 to 150 are arranged symmetrically to one another with respect to point P0. Therefore, changes of the resistance values depending on the rotation of rotating magnet 170 can be the same. As a result, a rotation angle can be easily obtained based on output voltages from output electrodes 104 and 105. Even when the symmetrical disposition is reversed, the same effect can be obtained. However, the shapes of magnetoresistance elements 120 to 150 may not be the same. Further, magnetoresistance elements 120 to 150 may not be symmetrical with respect to a point.

In the embodiments, bias magnet 160 is disposed on surface 101B of board 101. However, bias magnet 160 may be disposed on surface 101A of board 101. In this case, bias magnet 160 may be disposed between surface 101A and magnetoresistance element group 116 or may be disposed on magnetoresistance element group 116.

In the embodiments, bias magnet 160 is disposed such that a line connecting N pole 161 to S pole 162 is perpendicular to surface 101B of board 101. However, the line connecting N pole 161 to S pole 162 may be parallel to surface 101B of board 101. In the case that the line connecting N pole 161 to S pole 162 is parallel to surface 101B of board 101, a change of a magnetic field is larger than that in the case that the line connecting N pole 161 to S pole 162 is perpendicular to surface 101B of board 101. Therefore, it is necessary that efforts are made such that the changes in the resistance values of magnetoresistance elements 120 to 150 depending on the change of a magnetic field are not substantially saturated.

In the embodiments, terms, "equal" and "the same" do not mean being physically completely equal or the same and allows a tolerance in which some features are substantially equal or the same.

INDUSTRIAL APPLICABILITY

A magnetic sensor according to the invention has a high sensitivity to a magnetic field and is applicable to an apparatus requiring high sensitivity such as a vehicle.

REFERENCE MARKS IN THE DRAWINGS 1 board
2 magnetoresistance element (first magnetoresistance element)
3 magnetoresistance element (second magnetoresistance element)
4 magnetoresistance element (third magnetoresistance element)
5 magnet (first magnet)
6 magnet (second magnet)
7 magnet (third magnet)
8 adhesive
9 positioning portion
10 wiring
11 voltage application pad
12 ground pad
13-16 output terminal
17 protective film
18 wiring
19 external terminal
20 die pad 30 pad
95 magnetic sensor
96 target magnet
100 magnetic sensor
101 board
102 applying electrode
103 ground electrode
104, 105 output electrode
106 to 115 wiring
113 jumper line
116 magnetoresistance element group
120 magnetoresistance element
121-124 meandering portion
130 magnetoresistance element
131-134 meandering portion
140 magnetoresistance element
141-144 meandering portion
150 magnetoresistance element
151-154 meandering portion
160 bias magnet
161, 171 N pole
162, 172 S pole
170 rotating magnet
175 rotation shaft

The invention claimed is:

1. A magnetic sensor comprising:
   a board having a first surface;
   a magnetoresistance element group consisting of a first magnetoresistance element disposed on the first surface of the board, a second magnetoresistance element disposed on the first surface of the board, and a third magnetoresistance element disposed on the first surface of the board; and
   a magnet group consisting of a first magnet corresponding to the first magnetoresistance element, a second magnet corresponding to the second magnetoresistance element, and a third magnet corresponding to the third magnetoresistance element,
   wherein, in a plan view, the second magnetoresistance element and third magnetoresistance element are arranged symmetrically to each other with respect to a first axis, the second magnet and the third magnet are arranged symmetrically to each other with respect to the first axis, and the first magnetoresistance element and the first magnet are disposed on the first axis.

2. The magnetic sensor of claim 1,
   wherein a direction of a magnetic field at a center of the second magnet is parallel to a direction of a magnetic field at a center of the third magnet, and
   wherein a direction of a magnetic field at a center of the first magnet is perpendicular to the direction of the magnetic field at the center of the second magnet.

3. The magnetic sensor of claim 1, wherein sizes of the second magnetoresistance element and the third magnetoresistance element are smaller than a size of the first magnetoresistance element.

4. The magnetic sensor of claim 1, further comprising a processing circuit disposed on the first surface of the board between the second magnetoresistance element and the third magnetoresistance element, the processing circuit being configured to process a signal output from the magnetoresistance element group.

5. The magnetic sensor of claim 1, wherein the magnetic field at the center of the third magnet faces the magnetic field at the center of the second magnet.

6. The magnetic sensor of claim 1, further comprising an adhesive made of a thermosetting adhesive or an UV-curable adhesive to cause the first magnet to adhere to the first magnetoresistance element.

7. The magnetic sensor of claim 6, wherein the adhesive covers a portion of a side surface of the first magnet.

8. The magnetic sensor of claim 1, further comprising a positioning portion provided on the first surface of the board as to position a corner of the first magnet.

9. The magnetic sensor of claim 8, wherein the positioning portion is made of a metal.

10. The magnetic sensor of claim 8, further comprising a wiring extending from the magnetoresistance element group and made of material identical to material of the positioning portion.

11. The magnetic sensor of claim 1, wherein the first magnet, the second magnet, and the third magnet contain resin and rare earth magnet powder dispersed in the resin.

12. The magnetic sensor of claim 11,
    wherein the resin contains thermosetting resin, and
    wherein the rare earth magnet powder is SmFeN magnet powder.

13. The magnetic sensor of claim 1, further comprising a protective film disposed on the magnetoresistance element group, the protective film including a silicon oxide film or a fluororesin film.

14. The magnetic sensor of claim 1,
    wherein the board further has a second surface opposite to the first surface, and
    wherein the magnetic sensor further comprises a die pad mounted onto the second surface of the board.

15. The magnetic sensor of claim 1,
    wherein the first magnet applies a first magnetic bias to the first magnetoresistance element,
    wherein the second magnet applies a second magnetic bias to the second magnetoresistance element, and
    wherein the third magnet applies a third magnetic bias to the third magnetoresistance element.

16. The magnetic sensor of claim 1, wherein the first magnet is disposed on the first magnetoresistance element and the second magnet is disposed on the second magnetoresistance element and a third magnet is disposed on the third magnetoresistance element.

17. The magnetic sensor of claim 1, where each of the second magnetoresistance element, the second magnet, the third magnetoresistance element and the third magnet are disposed on a second axis, and the second axis is perpendicular to the first axis.

* * * * *